United States Patent
Reinart

(10) Patent No.: US 9,344,120 B2
(45) Date of Patent: May 17, 2016

(54) ADJUSTING REDUNDANCY IN AN ERASURE CODE OBJECT STORE TO ACCOUNT FOR VARYING DATA VALUE

(71) Applicant: Quantum Corporation, San Jose, CA (US)

(72) Inventor: John Reinart, Roseville, MN (US)

(73) Assignee: Quantum Corporation, San Jose, CA (US)

( * ) Notice: Subject to any disclaimer, the term of this patent is extended or adjusted under 35 U.S.C. 154(b) by 161 days.

(21) Appl. No.: 14/179,759

(22) Filed: Feb. 13, 2014

(65) Prior Publication Data

US 2015/0229339 A1    Aug. 13, 2015

(51) Int. Cl.
*H03M 13/37* (2006.01)
*H03M 13/15* (2006.01)
*H03M 13/45* (2006.01)
*H03M 13/35* (2006.01)
*G06F 11/10* (2006.01)
*G06F 3/06* (2006.01)
*G06F 3/00* (2006.01)

(52) U.S. Cl.
CPC ............... *H03M 13/373* (2013.01); *G06F 3/00* (2013.01); *G06F 3/0689* (2013.01); *G06F 11/10* (2013.01); *G06F 11/1048* (2013.01); *G06F 11/1076* (2013.01); *H03M 13/154* (2013.01); *H03M 13/35* (2013.01); *H03M 13/3761* (2013.01); *H03M 13/455* (2013.01)

(58) Field of Classification Search
CPC .......... H03M 13/373; H03M 13/3761; H03M 13/154; H03M 13/455; H03M 13/35; G06F 11/10; G06F 11/1076; G06F 11/1048; G06F 3/0689

USPC .......... 714/769, 752, 763, 768, 774, 786, 6.1, 714/6.22
See application file for complete search history.

(56) References Cited

U.S. PATENT DOCUMENTS

| | | | | |
|---|---|---|---|---|
| 8,850,288 | B1 * | 9/2014 | Lazier | G06F 11/1048 714/763 |
| 8,869,001 | B1 * | 10/2014 | Lazier | H03M 13/293 711/112 |
| 9,032,061 | B1 * | 5/2015 | Xin | H04L 12/283 709/223 |
| 9,110,797 | B1 * | 8/2015 | Lazier | G06F 11/0727 |
| 2004/0225913 | A1 * | 11/2004 | Hori | G06F 11/1092 714/6.22 |

(Continued)

OTHER PUBLICATIONS

Qureshi et al., Primer and Recent Developments on Fountain Codes, May 4, 2013, pp. 1-9.*

(Continued)

*Primary Examiner* — John J Tabone, Jr.
(74) *Attorney, Agent, or Firm* — Eschweiler & Associates, LLC

(57) ABSTRACT

Example apparatus and methods control the number of rate-less erasure codes (e.g., fountain codes) stored in an object store for an item (e.g., file stored as object). The codes for the item may be generated according to an M/N policy. A first safety factor that controls how many codes are stored initially in the object store is identified. A first number of codes are then stored in the object store, where the first number is selected as a function of the first safety factor. A second safety factor for the item and a condition under which the second safety factor is to be used to control the number of codes to be stored in the object store is also identified. When the condition is detected, a second number of codes are stored in the object store, where the second number is selected as a function of the second safety factor.

15 Claims, 10 Drawing Sheets

(56) References Cited

U.S. PATENT DOCUMENTS

| | | | | |
|---|---|---|---|---|
| 2004/0250019 | A1* | 12/2004 | Fujie | G06F 11/1076 711/114 |
| 2005/0160309 | A1* | 7/2005 | Golding | G06F 3/0608 714/6.22 |
| 2010/0094972 | A1* | 4/2010 | Zuckerman | H04L 67/1008 709/219 |
| 2010/0095012 | A1* | 4/2010 | Zuckerman | H04L 67/1002 709/231 |
| 2010/0095184 | A1* | 4/2010 | Zuckerman | H04L 67/1008 714/751 |
| 2012/0047201 | A1* | 2/2012 | Jain | H04N 21/26225 709/203 |
| 2013/0339818 | A1* | 12/2013 | Baker | G06F 11/10 714/763 |
| 2014/0160248 | A1* | 6/2014 | Pomerantz | G06F 1/163 348/47 |
| 2014/0160250 | A1* | 6/2014 | Pomerantz | H04N 5/23229 348/47 |
| 2014/0281784 | A1* | 9/2014 | Verma | G06F 11/1092 714/752 |
| 2015/0227416 | A1* | 8/2015 | Reinart | H03M 13/154 714/763 |
| 2015/0236724 | A1* | 8/2015 | Reinart | G06F 11/10 714/774 |
| 2015/0236725 | A1* | 8/2015 | Reinart | G06F 11/10 714/774 |

OTHER PUBLICATIONS

Dimaki et al., Network Coding for Distributed Storage in Wireless Networks, Department of Electrical Engineering and Computer Science, University of California, Berkeley, CA, pp. 1-19. 2008, Springer Science+Business Media, LCC.*

Chong et al., Stepping-Random Code: A Rateless Erasure Code for Short-Length Messages, Jul. 2013, IEICE Trans. Commun., vol. E96-B, No. 7, pp. 1764-1771.*

MacKay, Fountain codes, Dec. 2005, IEE Proc.-Commun., vol. 152, No. 6, pp. 1062-1062.*

* cited by examiner

ADJUSTING REDUNDANCY IN AN ERASURE CODE OBJECT STORE TO ACCOUNT FOR VARYING DATA VALUE

BACKGROUND

The value of data may vary over time. However, conventional object storage systems may treat data the same throughout its lifetime, regardless of the freshness of the data. For example, conventional systems may employ a static or pre-defined disk safety factor that controls the redundancy of data by controlling how many erasure codes are stored for an item. In these conventional systems, the safety factor may be established once when the data is stored.

The value of some data may increase over time. For example, in an archive scenario, the original source content may be the most important to protect, while recent changes to the original source content may be less valuable. The value of other data may decrease over time. For example, in a backup scenario, the newest data or the most recently saved data may be important right after it is saved, but may be less important as time moves on. Over time, other backup copies may be made, which may reduce the value of an earlier backup. Consider analytic data like a weblog. Data in a weblog may have greater value when new but then may have less and less value over time as, for example, more recent data is saved to the weblog.

Conventional systems may be unable to dynamically adjust the disk safety factor for an item and thus may be unable to account for the changing value of data over time. Being unable to account for the changing value of data may require choosing between wasting storage space for excessive redundancy at some point in the data life cycle or saving storage but being exposed to an undesirable risk of data loss at some point in the data life cycle.

Different approaches may be used to protect files, information about files, or other electronic data. For example, an object store may interact with an archive system to store a file, to store information about a file, or to store other electronic data. To insure data protection, different approaches for storing redundant copies of items have been employed. Erasure codes are one such approach. An erasure code is a forward error correction (FEC) code for the binary erasure channel. The FEC facilitates transforming a message of k symbols into a longer message with n symbols such that the original message can be recovered from a subset of the n symbols, k and n being integers, n>k. The original message may be, for example, a file. The fraction r=k/n is called the code rate, and the fraction k'/k, where k' denotes the number of symbols required for recovery, is called the reception efficiency. Optimal erasure codes have the property that any k out of the n code word symbols suffice to recover the original message. Optimal codes may require extensive memory usage, CPU time, or other resources when n is large.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure code.

Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. A rateless erasure code is distinguished from an erasure code that exhibits a fixed code rate.

Object based storage systems may employ rateless erasure code technology (e.g., fountain codes) to provide a flexible level of data redundancy. The appropriate or even optimal level of data redundancy produced using a rateless erasure code system may depend, for example, on the value of the data. The actual level of redundancy achieved using a rateless erasure code system may depend, for example, on the difference between the number of readable redundancy blocks (e.g., erasure codes) written by the system and the number of redundancy blocks needed to reconstruct the original data. For example, if twenty redundancy blocks are written and only eleven redundancy blocks are needed to reconstruct the original data that was protected by generating and writing the redundancy blocks, then the original data may be reconstructed even if nine of the redundancy blocks are damaged or otherwise unavailable.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
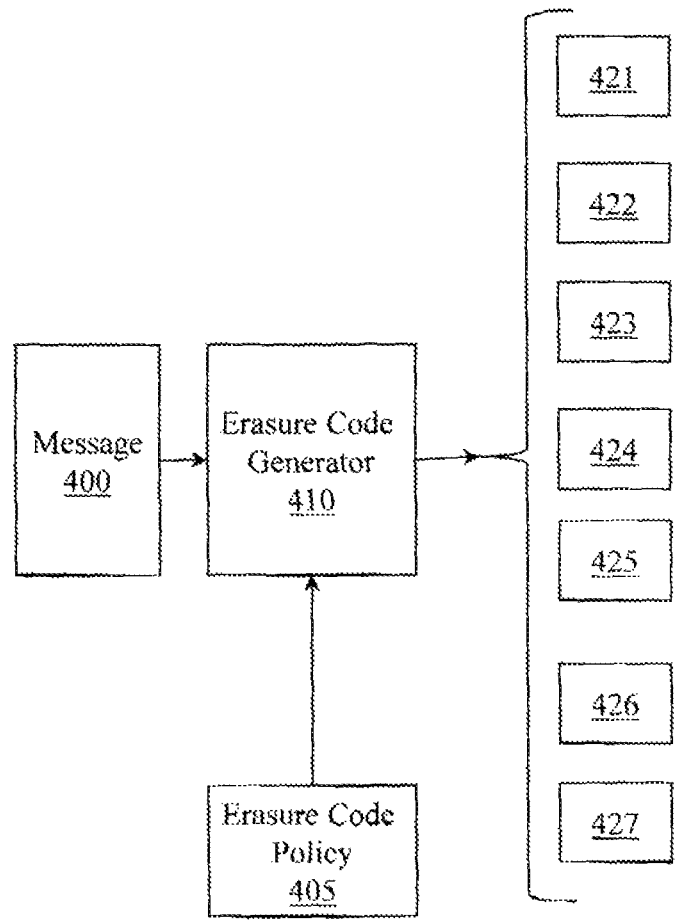
FIG. 1 illustrates an erasure code generator.

Example apparatus and methods facilitate dynamically adjusting a safety factor for data protected by an object store that stores items using erasure code technology. The number of erasure codes written to the object store may be determined by the safety factor. The safety factor may be adjusted dynamically to account for characteristics of data that may change over time and that may influence the value of data. The characteristics may include, for example, the age of the data, the value of the data, the number of locations at which data is stored, the number of copies of data that are stored locally or at other locations, the source of data, the cost to acquire the data, or other factors. For example, some data may become more valuable or more expensive to acquire over time and thus the safety factor for that data may be increased over time. Other data may become less valuable or less expensive to acquire over time and thus the safety factor for that data may be decreased over time. Some data may be stored in just one location, and thus the safety factor for that data at that one location may be very high. However, as the data is stored in more locations, it may be possible to reduce the safety factor at one or more locations while maintaining a high safety factor at a most reliable location.

The safety factor may control, for example, the redundancy level for the data. The redundancy level may control how many erasure codes above the minimum number of erasure codes needed to reconstruct an item are stored. Object based storage systems that use rateless erasure code (e.g., fountain code) technology facilitate adjusting a disk safety factor by, for example, adjusting the number of redundant erasure codes that are written for data. Recall that using erasure codes, an M/N policy may be employed to store data, M and N being integers, M>N. The M/N policy refers to the fact that to reconstruct a message for which M erasure codes are generated, only M−N erasure codes may need to be accessed. While M erasure codes may be generated, example apparatus and methods may control how many of the M erasure codes are stored in an object store based on the safety factor to be protected by the M erasure codes.

Example apparatus and methods may provide or interact with a user interface that facilitates identifying an initial safety factor for data and conditions under which the safety factor may be changed automatically. For example, the user interface may allow a user to specify an initial safety factor, an age for the item at which the safety factor is supposed to change, and the new safety factor to be established for the item. The user interface may allow a user to specify one or more conditions and one or more new safety factors. For example, a user may establish an initial safety factor for an item (e.g., file) and control that the initial safety factor is to remain in place during a first time period. The user may also establish a second safety factor for the item and control that the second safety factor is to be established for a second time period. Third, fourth, and even more safety factors and time periods may also be established. By way of illustration, a user may identify that data associated with a certain weblog is to begin with a safety factor of four and that the initial safety factor is to be applied for data associated with that weblog until that data is seven days old. The safety factor of four may cause N+4 of the M erasure codes generated according to the M/N policy to be stored in an object store. The user may identify that data associated with the weblog that is between seven days old and thirty days old is to have a safety factor of three, that data associated with the weblog that is between thirty days old and ninety days old is to have a safety factor of two, that data associated with the weblog that is between ninety days old and three hundred and sixty five days old is to have a safety factor of one, and that data associated with the weblog that is older than three hundred and sixty five days is to have a safety factor of zero.

In one embodiment, the safety factor may control how many erasure codes are stored in an object store. Consider a 20/11 policy associated with the weblog described in the previous paragraph. A safety factor of four may indicate that 13 erasure codes are to be stored, a safety factor of three may indicate that 12 erasure codes are to be stored, a safety factor of two may indicate that 11 erasure codes are to be stored, a safety factor of one may indicate that 10 erasure codes are to be stored, and a safety factor of zero may indicate that only 9 erasure codes, which is the minimum number needed to reconstruct a message protected by the 20/11 policy, are to be stored. Thus, data whose value is decreasing over time may have the total number of erasure codes stored in the object store reduced. Conversely, data whose value is increasing over time may have the total number of erasure codes stored in the object store increased. An object store, which may also be referred to as an object storage, performs object-based storage where a storage architecture manages data as objects instead of, for example, as files.

FIG. 1 illustrates an erasure code generator 410. A message 400 (e.g., file, object) may be presented to the erasure code generator 410 and a number of erasure codes may be generated for the message 400 as controlled by an erasure code policy 405. For example, erasure code generator 410 may produce erasure code 421, erasure code 422, erasure code 423, erasure code 424, erasure code 425, erasure code 426, and erasure code 427 according to a 7/4 erasure code policy 405. The message 400 may be reconstructed from any three of the seven erasure codes. How many of the seven erasure codes are stored by example apparatus and methods may depend, at least in part, on a safety factor that can control erasure code storage in an object store.

Figure 2:
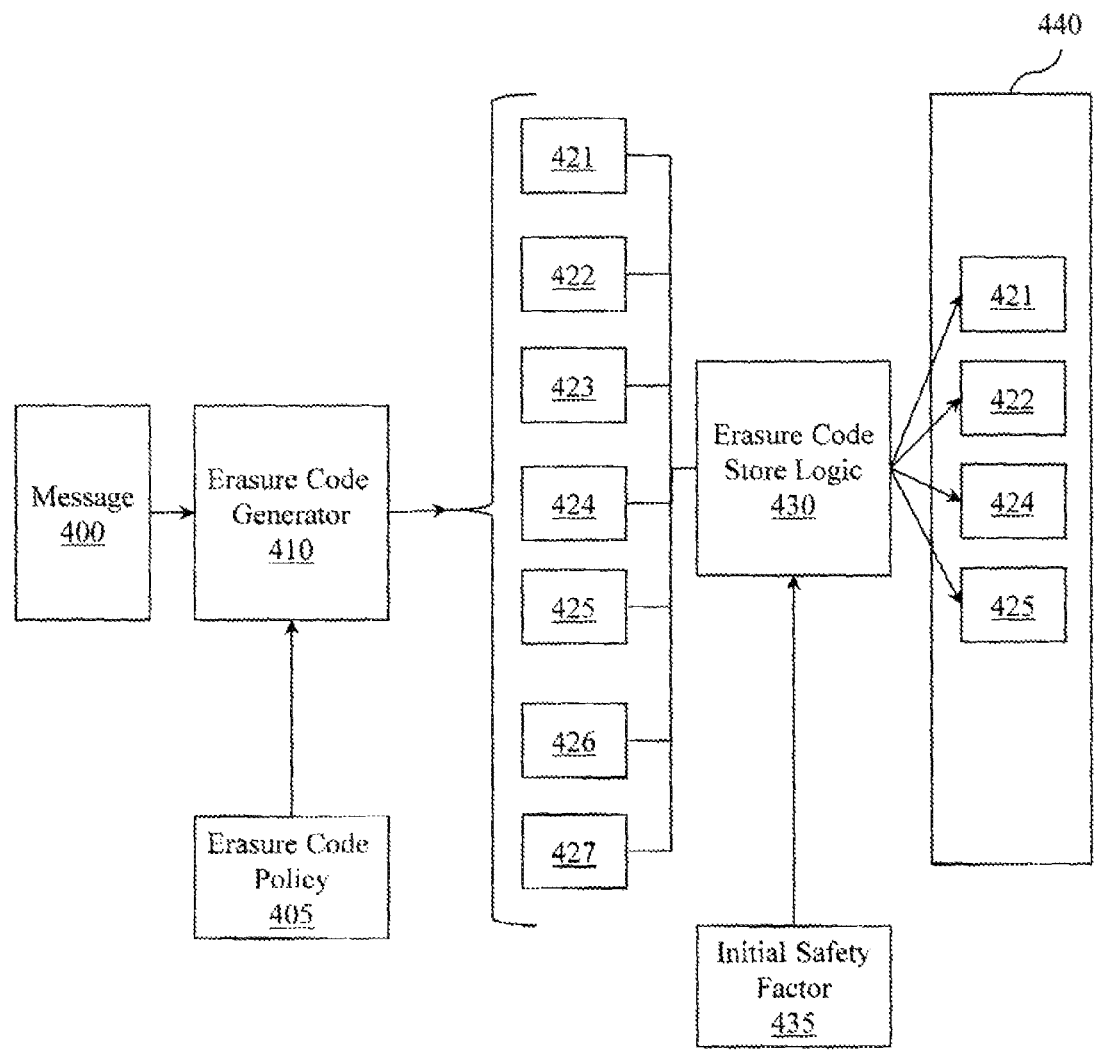
FIG. 2 illustrates establishing an initial safety factor for an item and controlling an object store based on the initial safety factor.

FIG. 2 illustrates establishing an initial safety factor 435 for storing an item in an object store 440 and controlling the object store 440 based on the initial safety factor 435. Controlling the object store based on the initial safety factor may include determining how many of M erasure codes generated according to an M/N policy are stored in the object store 440. An erasure code store logic 430 may store a selected number of erasure codes in the object store 440 based on the initial safety factor 435. FIG. 2 illustrates four erasure codes stored in object store 440. For example, erasure code 421, erasure code 422, erasure code 424, and erasure code 425 may be stored in object store 440 in response to the initial safety factor 435 identifying a safety factor of one. The initial safety factor 435 may be mapped, for example, to a number of erasure codes above the minimum number of erasure codes N−M to be stored. In the example, when the erasure code policy is a 7/3 policy, and when the initial safety factor 435 is 1, then four erasure codes may be stored in the object store 440, where four is one more than the minimum number of three described by N−M. The number of erasure codes stored in object store 440 may be increased or decreased based on changes to the safety factor.

Figure 3:
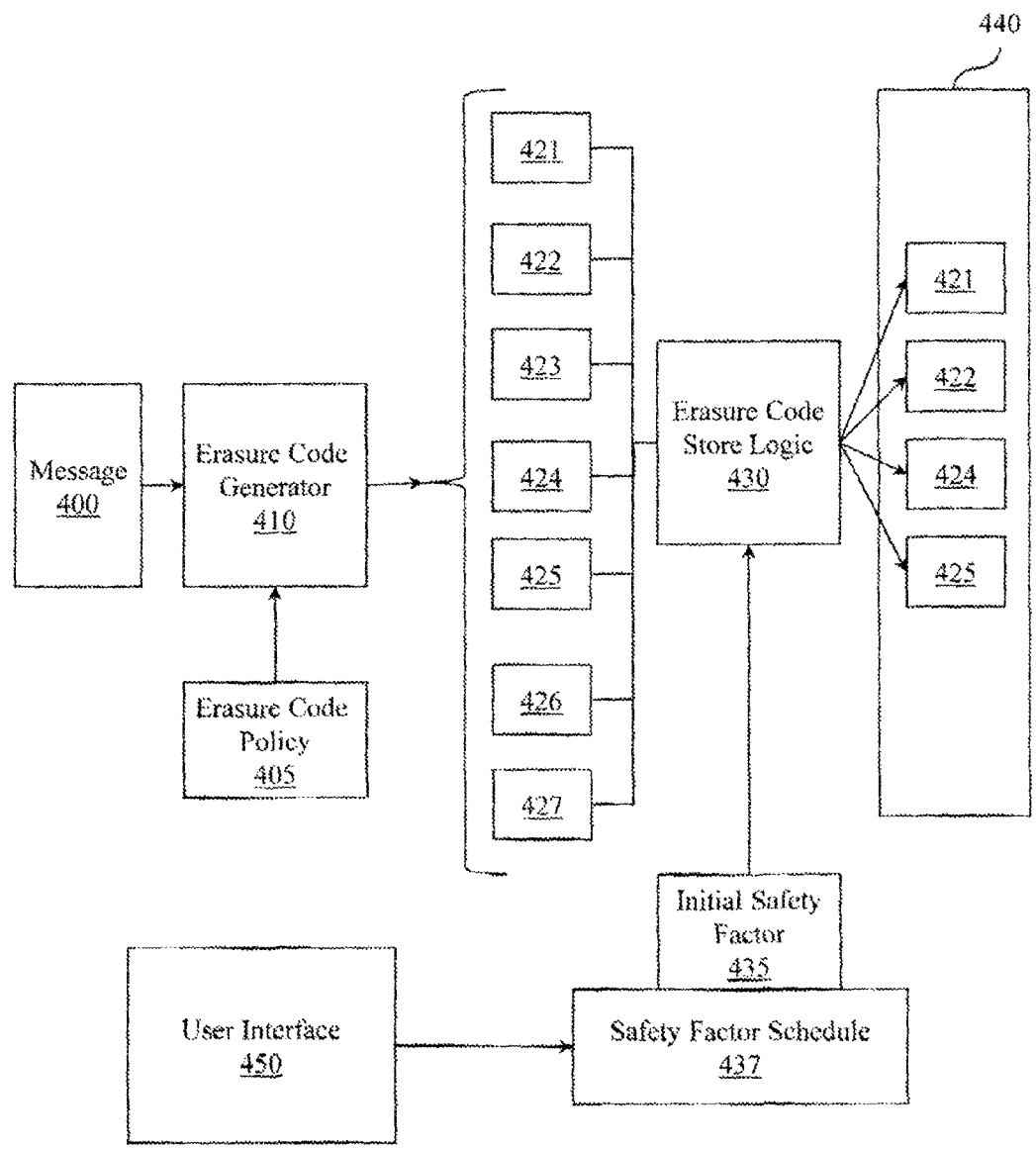
FIG. 3 illustrates establishing a schedule of safety factors for an item.

FIG. 3 illustrates establishing a schedule 437 of safety factors for an item. The schedule 437 may be established, for example, by a user interacting with a user interface 450. A user may identify an item and a set of safety factors to establish or maintain based on different conditions. By way of illustration, a user may specify a first time interval and a first safety factor, and a second time interval and second safety factor through an Xth safety factor for an Xth interval, X being an integer. By way of further illustration, a user may specify a first safety factor schedule for a first data type, a second safety factor schedule for a second data type, and a third safety factor for a third data type. The schedule may define time intervals or other change conditions. For example, the safety factor may be determined by the number of copies of an item that have been stored, by a number of different apparatus on which an item has been stored, by an age of an item, by a cost to acquire the item, by a value of the item, or on other factors.

Figure 4:
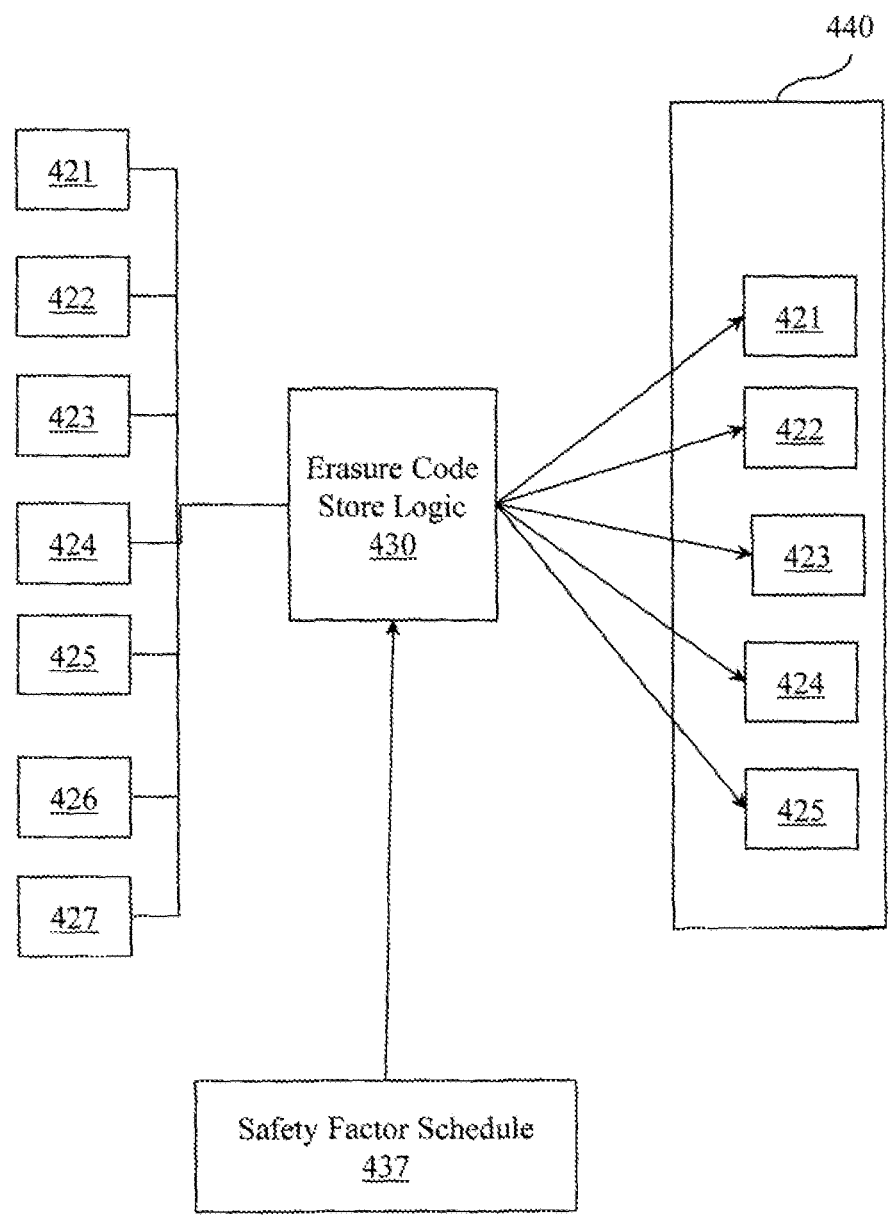
FIG. 4 illustrates controlling an object store to increase the safety factor for an item.

FIG. 4 illustrates controlling an object store 440 to increase the safety factor for an item based on the safety factor schedule 437. Increasing the safety factor may cause an additional erasure code(s) to be stored in the object store 440. The increase may be controlled, for example, by the erasure code store logic 430 as controlled by the safety factor schedule 437. The initial number of erasure codes stored in object store 440 for an item may have been established by the initial safety factor 435 (FIG. 3) but the current number of erasure codes to be stored in object store 440 may be established and maintained by the erasure code store logic 430 as controlled by the safety schedule 437. In this example, where the safety factor schedule 437 indicates that for the current time period there are supposed to be two erasure codes above the minimum three erasure codes defined by the 7/4 policy, five erasure codes are to be stored for the item in object store 440. Thus, erasure code 423 may be added to object store 440 by the erasure code store logic 430.

Figure 5:
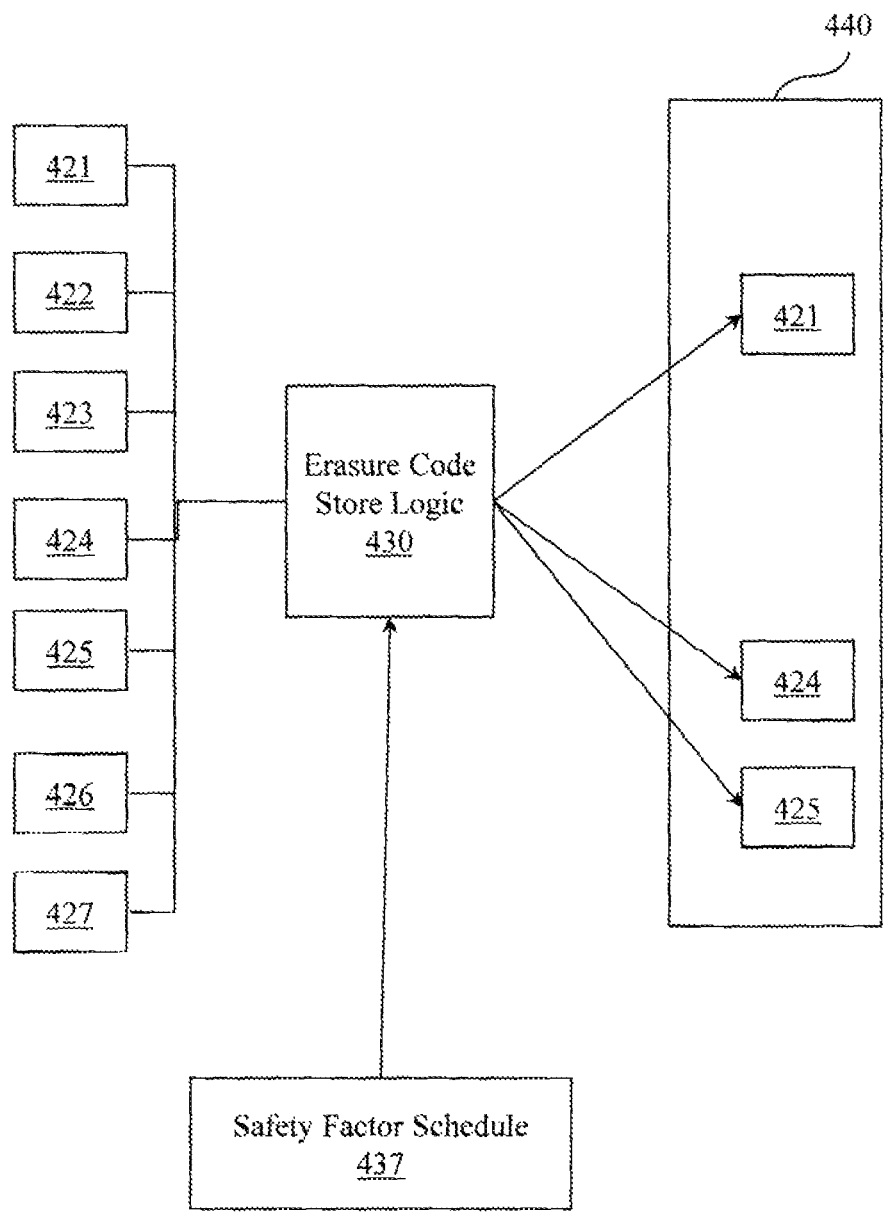
FIG. 5 illustrates controlling an object store to decrease the safety factor for an item.

FIG. 5 illustrates controlling an object store 440 to decrease the safety factor for an item. Decreasing the safety factor may cause an erasure code(s) to be removed from the object store 440. The decrease may be controlled, for example, by the erasure code store logic 430 as controlled by the safety factor schedule 437. The initial number of erasure codes stored in object store 440 for an item may have been established by the initial safety factor 435 (FIG. 3) but the current number of erasure codes to be stored in object store 440 may be established and maintained by the erasure code store logic 430 as controlled by the safety factor schedule 437. When the safety factor in the safety factor schedule 437 is zero, indicating that only the minimum number M−N of erasure codes from the M/N policy are to be stored, then the erasure code store logic 430 may cause erasure codes to be removed from the object store 440. For example, erasure code 422 and erasure code 423 may be removed from object store 440.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
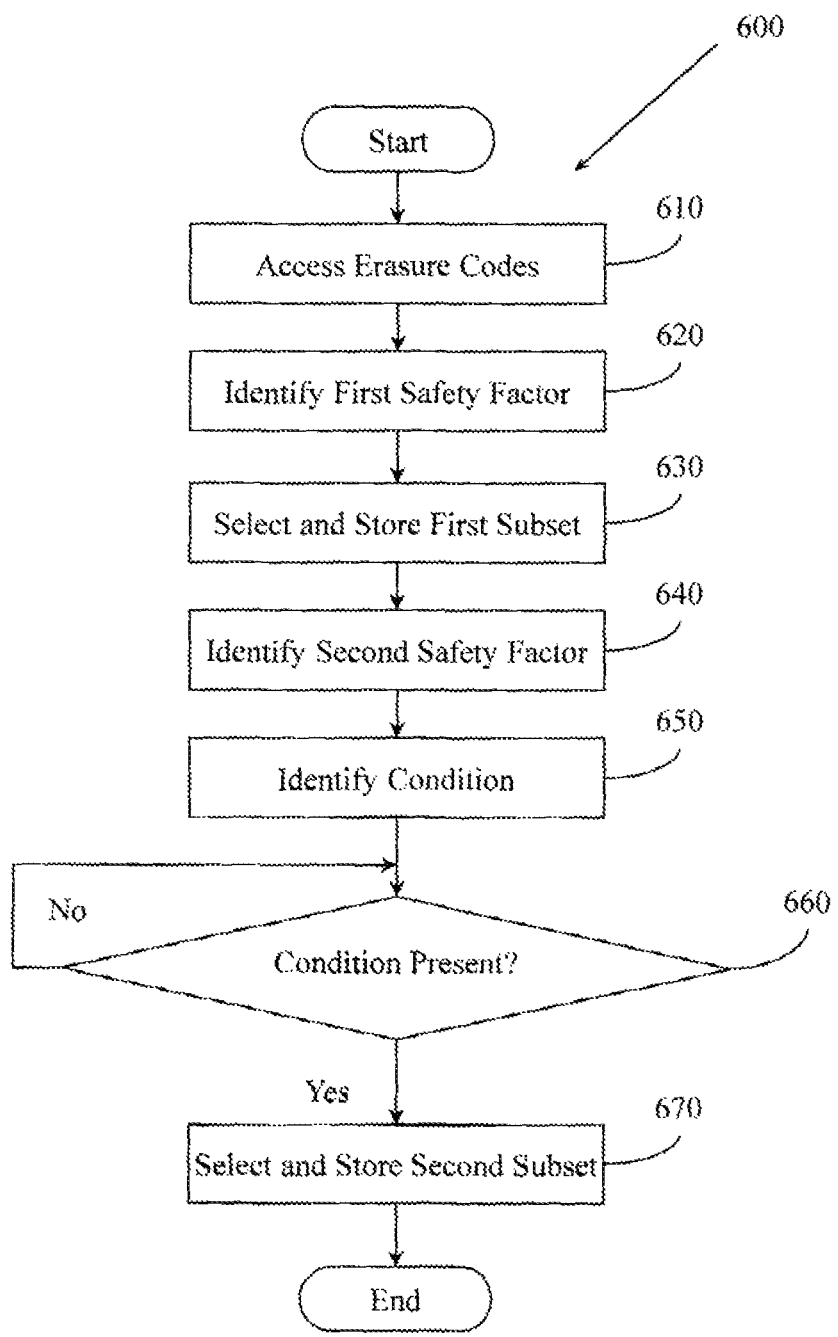
FIG. 6 illustrates an example method associated with dynamically adjusting redundancy in an erasure code object store to account for varying value of data.

FIG. 6 illustrates a method 600 associated with dynamically adjusting redundancy in an erasure code object store to account, for example, for varying values of data. Method 600 may include, at 610, accessing a set of rateless erasure codes generated for an item. The rateless erasure codes may have been generated according to an M/N policy, where M is greater than N, and M/N describes a minimum number of the set of M rateless erasure codes from which the item can be reconstructed.

Method 600 may also include, at 620, identifying a first safety factor for the item. The first safety factor controls how many members of the set of rateless erasure codes are to be stored in an object store. In one embodiment, the first safety factor identifies how many rateless erasure codes beyond the minimum number M−N are to be stored in the object store initially. In one embodiment, the first safety factor may be computed as a function of a data type for the item, as a function of a user of the item, as a function of a cost to acquire the item, as a function of a value associated with the item, or as a function of a source of the item. For example, a first safety factor may be established for word processing files while a different first safety factor may be established for weblog data.

Method 600 may also include, at 630, selecting a first number of the set of rateless erasure codes to be stored in the object store. The first number may be selected based, at least in part, on the first safety factor. Once the first number of rateless erasure codes has been selected, method 600 may provide the first number of rateless erasure codes to the object store. Providing the first number of rateless erasure codes to the object store may include, for example, communicating a code over a communication pathway, communicating a pointer to a code over the communication pathway, making a function call that passes the code as an argument, making a function call that passes a pointer to the code as an argument, writing the code to a memory, writing the code to a shared memory, writing the code to a disk, or other action.

Method 600 may also include, at 640, identifying a second safety factor for the item. In one embodiment, the second safety factor identifies how many rateless erasure codes beyond the minimum number N−M are to be stored in the object store when the condition is detected. In one embodiment, the second safety factor may be identified as a function of a data type for the item, as a function of a user of the item, as a function of a cost to acquire the item, as a function of a value associated with the item, or as a function of a source of the item. For example, items acquired from a source that is nearby and reachable across a low cost, low latency communication channel may have one (e.g., lower) second safety factor while items acquired from a source that is far away and only reachable across a high cost, high latency communication channel may have a different (e.g., higher) second safety factor.

Method 600 may also include, at 650, identifying a condition under which the second safety factor is to be used to control how many members of the set of rateless erasure codes are to be stored in the object store. The condition may be based on different characteristics or attributes of the item. For example, the condition may be the age of the item. As the age of the item changes, the safety factor associated with the item may also change. For example, the safety factor may be increased for data whose value increases over time while the safety factor may be decreased for data whose value decreases over time. In one embodiment, the condition may be, for example, a number of copies of the item that are stored, the passage of an amount of time, the item reaching an age, a number of devices on which the item is stored, or other factors.

Method 600 may also include, at 660, determining whether the condition is present. If the condition is not present, method 600 may leave the first safety factor in place. Upon detecting the condition at 660, method 600 may proceed, at 670, to select a second number of the set of rateless erasure codes to be stored in the object store. The second number may be selected based, at least in part, on the second safety factor. Once the second number has been selected, method 600 may provide the second number of rateless erasure codes to the object store. Providing the second number of rateless erasure codes may include writing erasure codes to memory, writing rateless erasure codes to an input/output interface, writing rateless erasure codes to a disk, writing pointers to codes to a memory, a disk, or an interface, or other action.

Controlling the number of rateless erasure codes stored in the object store may cause the number of rateless erasure codes to be increased or decreased. Thus, method 600 may, at 670, selectively cause a rateless erasure code associated with the item to be removed from the object store upon determining that the number of rateless erasure codes associated with the item stored in the object store exceeds the number determined by the second safety factor. Method 600 may also, at 670, selectively cause a rateless erasure code associated with the item to be added to the object store upon determining that the number of rateless erasure codes associated with the item stored in the object store is less than the number determined by the second safety factor. Whether the number of rateless erasure codes is increased or decreased may depend on the actual or perceived value of an item.

Figure 7:
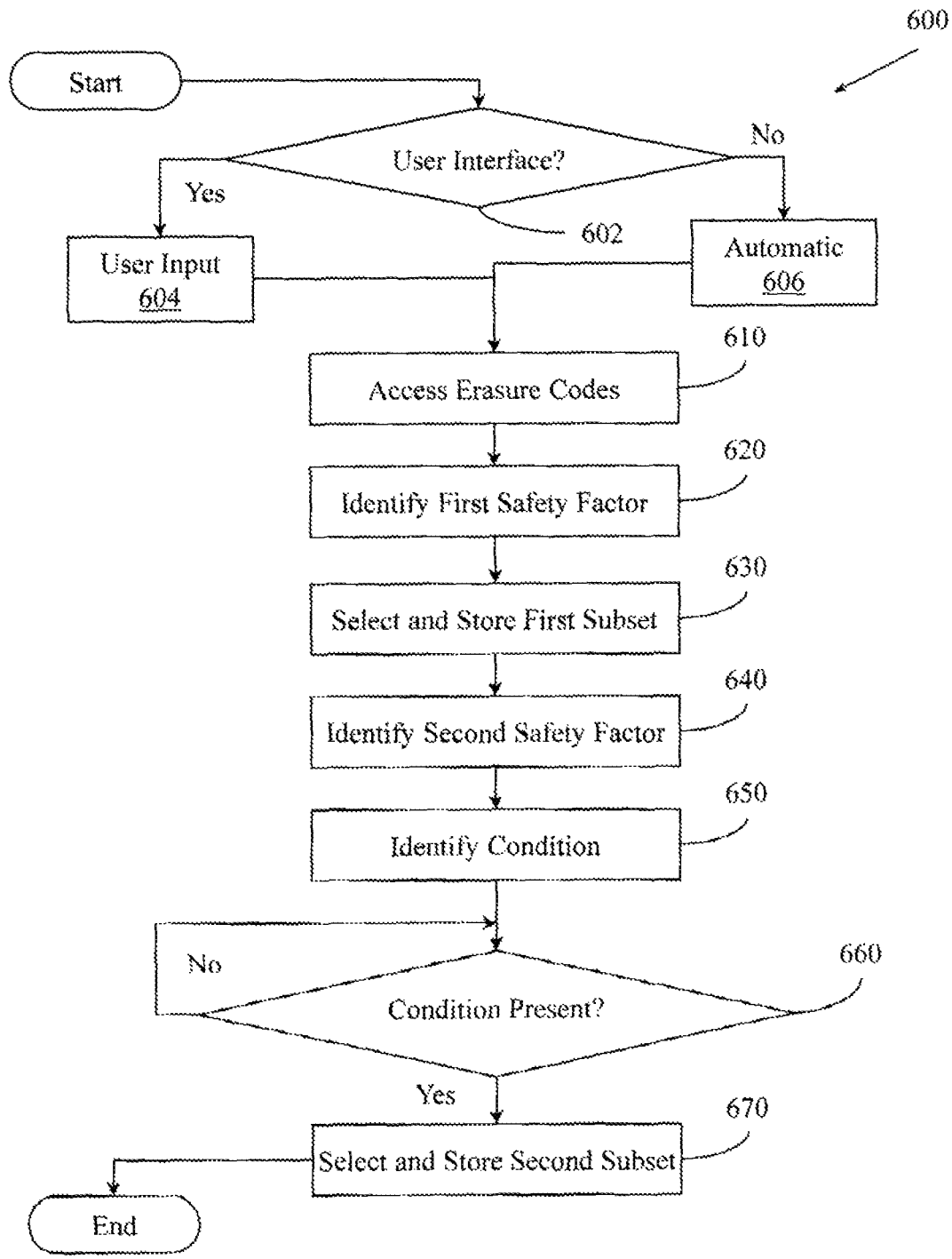
FIG. 7 illustrates an example method associated with dynamically adjusting redundancy in an erasure code object store to account for varying value of data.

FIG. 7 illustrates another embodiment of method 600. This embodiment includes, at 602, determining whether the safety factors will be produced automatically or in response to an input from a user interface. If the determination at 602 is that the safety factors will be produced in response to an input from a user interface, then method 600 may proceed, at 604, to receive a user input from a user interface. If the determination at 604 is that the safety factors are to be produced automatically, then method 600 may proceed, at 606, to automatically determine the first or second safety factor based on an attribute of the item. The attribute may be, for example, an age of the item, a source of the item, an owner of the item, or other attribute.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
RAM: random access memory.
DRAM: dynamic RAM.
SRAM: synchronous RAM.
ROM: read only memory.
PROM: programmable ROM.
SSD: solid state drive
SAN: storage area network.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal" as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
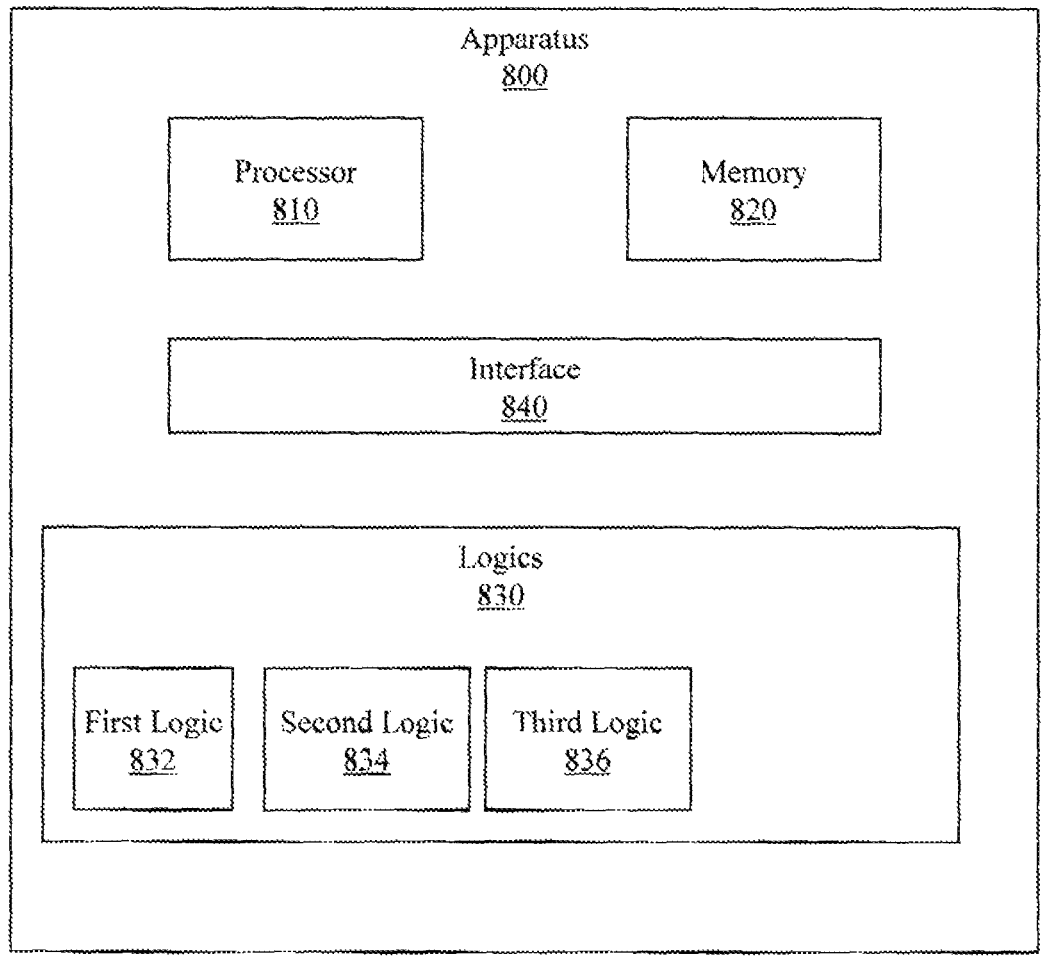
FIG. 8 illustrates an example apparatus configured to dynamically adjust the redundancy for data protected by an object store that stores items using erasure code technology.

FIG. 8 illustrates an apparatus 800 that includes a processor 810, a memory 820, and a set 830 of logics that is connected to the processor 810 and memory 820 by an interface 840. In one embodiment, the apparatus 800 may be an object storage system. In one embodiment, the apparatus 800 may be operably connected to or in data communication with an object storage system. Recall that an object storage system performs object-based storage using a storage architecture that manages data as objects instead of, for example, as files. "Object", as used herein, refers to the usage of object in computer science. From one point of view, an object may be considered to be a location in a physical memory having a value and referenced by an identifier.

The set 830 of logics may include a first logic 832 that is configured to establish a first subset of fountain codes to be stored by an object storage. The first subset of fountain codes may be stored for an item during a first time period. Establishing the first subset of fountain codes may include, for example, selecting fountain codes from a set of M fountain codes that were generated using an M/N policy, where M>N, and N–M describes the minimum number of fountain codes needed to reconstruct the item from the M fountain codes. Selecting the fountain codes may include, for example, copying fountain codes from a first location (e.g., memory) to a second location (e.g., disk), copying pointers to fountain codes from a first location (e.g., disk) to a second location (e.g., memory), or other action. The object storage may be, for example, an apparatus having a plurality of storage devices (e.g., disks, tapes, solid state devices). The first time period may be, for example, a number of minutes, a number of hours, a number of days, or other span of time during which the item is supposed to have an initial redundancy.

The first logic 832 may establish the first set of fountain codes based on different criteria or based on different characteristics of the item. In one embodiment, the first logic 832 may establish the first set of fountain codes based on the data type for the item. For example, weblog data may be protected using a first safety factor or redundancy, password files may be protected using a second, different safety factor or redundancy, and data associated with pending financial transactions may be protected using a third, different safety factor or redundancy. Other items or data types may have different safety factors. In one embodiment, the first logic 832 may establish the first set of fountain codes based on other attributes including, for example, a source for the item (e.g., local, remote), a cost to acquire the item (e.g., subscription price, bandwidth cost), or a value associated with the item. In one embodiment, the first logic 832 may receive information about how to establish the first set of fountain codes from a user input concerning the item.

The apparatus 800 may also include a second logic 834 that is configured to establish a second subset of fountain codes to be stored by the object storage. The second subset of fountain codes may be stored for the item during a second time period. Establishing the second subset of fountain codes may include, for example, selecting fountain codes from the set of M fountain codes that were generated using the M/N policy. Selecting the fountain codes may include, for example, copying fountain codes from a first location (e.g., disk) to a second location (e.g., memory), copying pointers to fountain codes from a first location (e.g., disk) to a second location (e.g., solid state device), or other action. The second time period may be, for example, a number of minutes, a number of hours, a number of days, or other span of time during which the item is supposed to have a second redundancy. While a first time period and a second time period are described, more generally, the second logic may establish a plurality of time periods and corresponding safety factors.

In one embodiment, the second logic 834 may establish the second set of fountain codes based on factors including, but not limited to, the data type for the item, the source for the item, a cost to acquire the item, a value associated with the item, or based on a second user input concerning the item. In one embodiment, the value of the item may be an objective value while in another embodiment the value may be a subjective value that depends on other factors like the age of the item.

In one embodiment, the second logic 834 is configured to establish a plurality of second subsets of fountain codes to be stored by the object storage for the item during a plurality of corresponding second time periods associated with a plurality of conditions. For example, ten different subsets of fountain codes having ten different sizes may be defined for ten different conditions. In different embodiments, the conditions may be based on individual facts (e.g., age, value) or on combinations of facts (e.g., age, value, cost to acquire).

The apparatus 800 may also include a third logic 836 that is configured to control the whether the first or second subset of fountain codes is stored by the object storage. The third logic 836 may determine which subset of fountain codes to have stored by the object storage based, for example, on time-based considerations. For example, the third logic 836 may select the first or second subset based on whether a current time is during the first time period or during the second time period. In one embodiment, the third logic 836 may select the first or second subset based on the age of the item. In one embodiment, the second logic 834 may establish a plurality of second subsets associated with a corresponding plurality of conditions. In this embodiment, the third logic 836 may be configured to control which of the plurality of second subsets of fountain codes are stored by the object storage based, at least in part, on which of the plurality of conditions is present.

Figure 9:
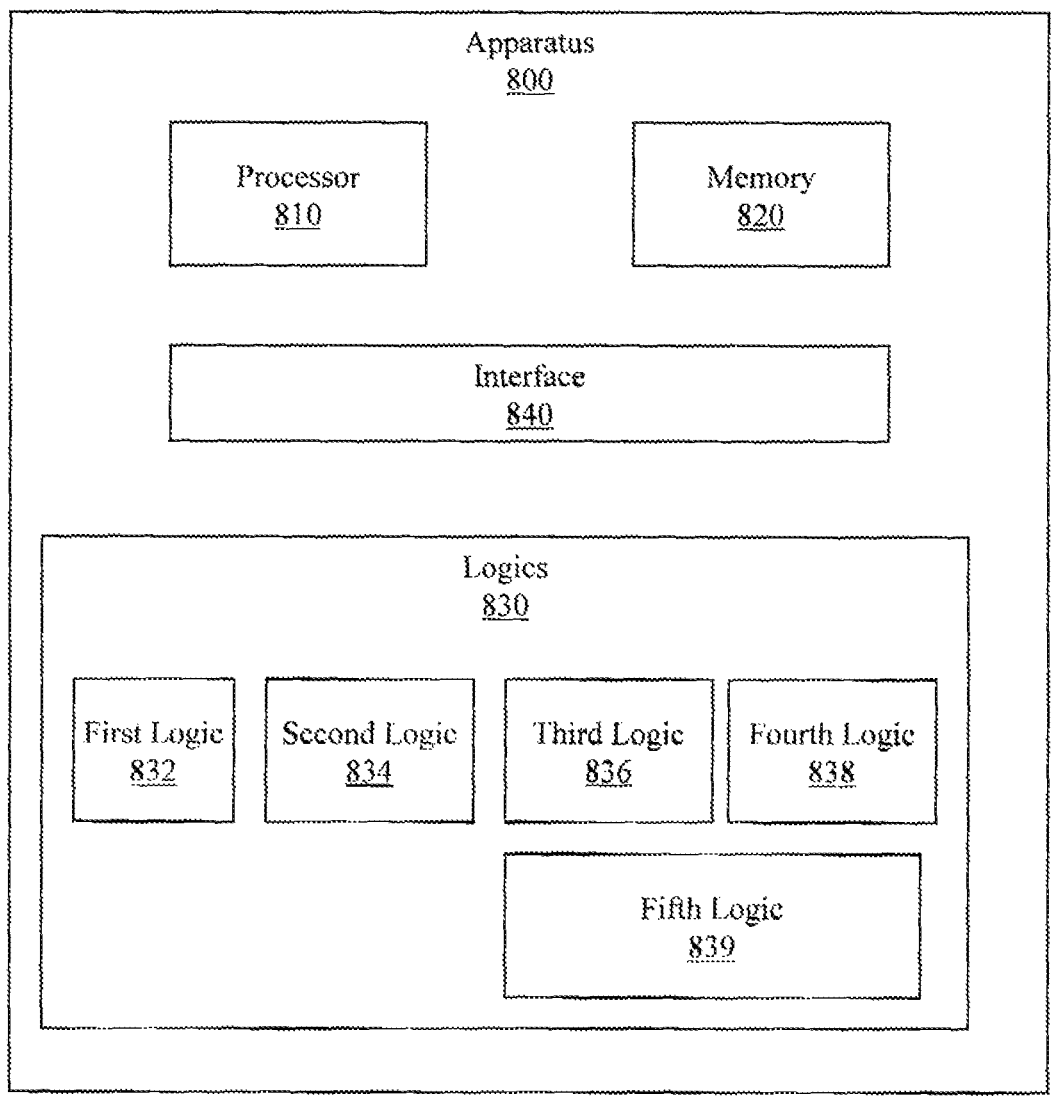
FIG. 9 illustrates an example apparatus configured to dynamically adjust the redundancy for data protected by an object store that stores items using erasure code technology.

FIG. 9 illustrates another embodiment of apparatus 800. This embodiment includes a fourth logic 838. The fourth logic 838 may be configured to generate a set of fountain codes from which the first or second set of fountain codes can be established. The fourth logic 838 may generate the set of fountain codes according to an M/N policy, where M identifies a maximum number of fountain codes to be generated for the item, N–M identifies a minimum number of fountain codes from which the item can be reconstructed, M>N, and M and N are integers. For example, fountain codes for a first item or first type of item may be generated according to a 7/4 policy where 7 fountain codes are generated and any 3 of the 7 fountain codes suffice to reconstruct the item. Fountain codes for a second item or second type of item may be generated according to a 20/11 policy where 20 fountain codes are generated and any 9 of the 20 codes are sufficient for reconstructing the item.

This embodiment may also include a fifth logic 839 that is configured to present a user interface concerning the item. The user interface may be presented on, for example, a computer, a laptop computer, a tablet computer, a smart phone, or other device that can present information and receive a user selection. Different data types or data having different characteristics (e.g., size) may be protected by different fountain code policies, therefore the fifth logic 839 may be configured to acquire, from the user interface, a value for M and a value for N. Different safety factors and redundancy policies may be suitable for different data types or data having different characteristics (e.g., value) and thus the fifth logic 839 may be configured to acquire, from the user interface, a value for the size of the first subset, a value for the size of the second subset, or other values. In one embodiment, default time periods may be established for data or for an item. However, a user may wish to customize or adapt the time periods. Therefore, in one embodiment, the fifth logic 839 may be configured to acquire, from the user interface, information describing the first time period, the second time period, or other time periods for an item or for a type of item.

Figure 10:
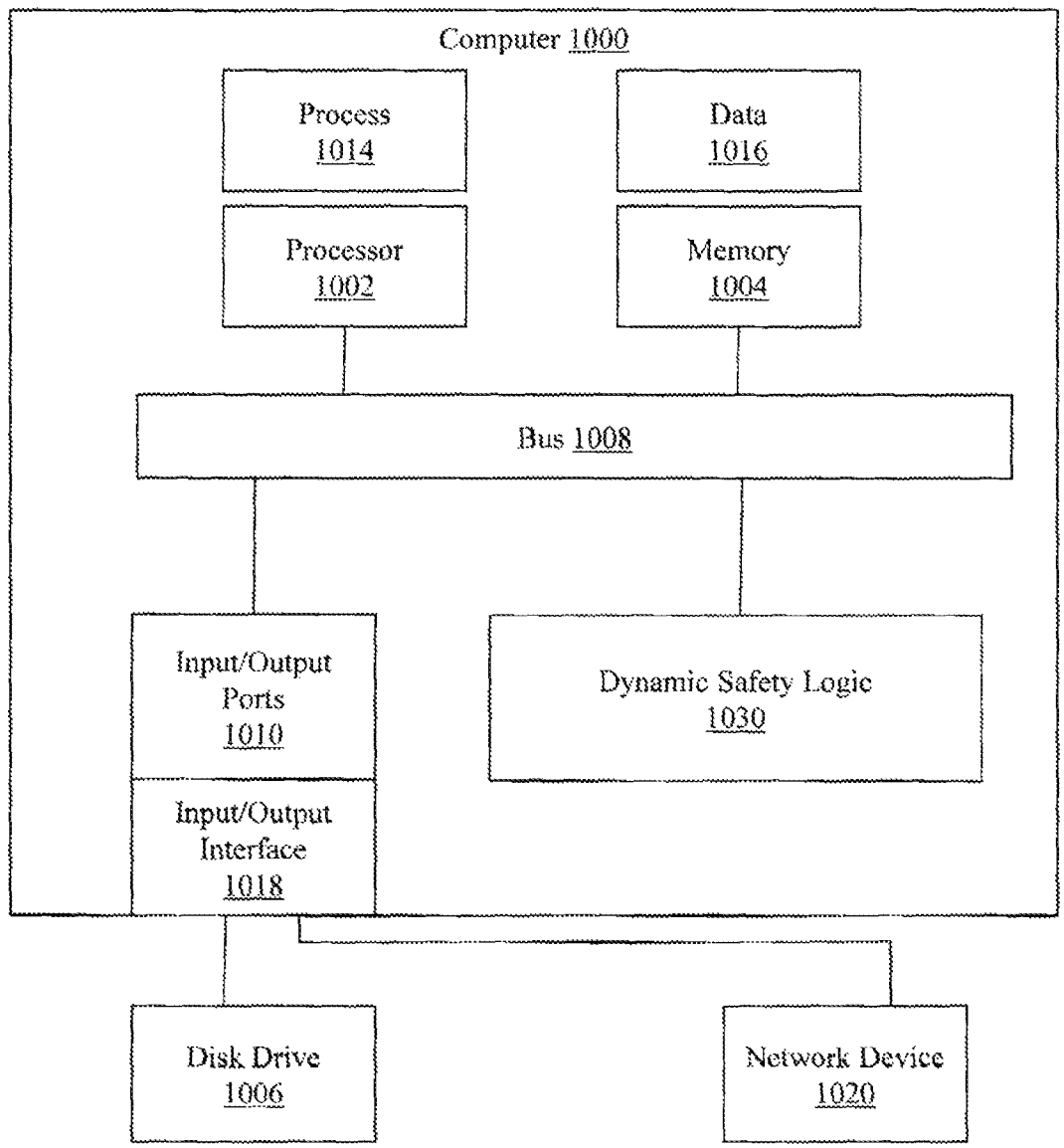
FIG. 10 illustrates an example apparatus associated with dynamically adjusting the redundancy for data protected by an object store that uses erasure code technology.

FIG. 10 illustrates an example computing device in which example systems and methods described herein, and equivalents, may operate. The example computing device may be a computer 1000 that includes a processor 1002, a memory 1004, and input/output ports 1010 operably connected by a bus 1008. In one example, the computer 1000 may include a dynamic safety logic 1030 that is configured to produce and store erasure codes in an object store. In different examples, the logic 1030 may be implemented in hardware, software, firmware, and/or combinations thereof. While the logic 1030 is illustrated as a hardware component attached to the bus 1008, it is to be appreciated that in one example, the logic 1030 could be implemented in the processor 1002.

In one embodiment, logic 1030 may provide means (e.g., hardware, software, firmware, circuit) for producing rateless erasure codes for a message. The rateless erasure codes may be, for example, fountain codes. Producing the rateless erasure codes may include, for example, receiving a message (e.g., file, record, data stream, weblog) and producing rateless erasure codes according to an M/N policy. Logic 1030 may also provide means for identifying different numbers of the rateless erasure codes to be stored in an object store for the message at different points in time. The different points in time may correspond to different ages of the message. For example, a message that is less than a day old may have a first number of erasure codes stored to produce a first level of redundancy while a message that is more than a day old may have a second, different number of erasure codes stored to produce a second, different level of redundancy. In one embodiment, multiple time periods may be established for the message. Logic 1030 may also provide means for controlling the object store to store a selected number of the rateless erasure codes in the object store. In one embodiment, how many of the rateless erasure codes for the message are stored is controlled, at least in part, by the age of the message.

The means associated with logic 1030 may be implemented, for example, as an ASIC that implements the functionality of apparatus described herein. The means may also be implemented as computer executable instructions that implement the functionality of methods described herein and that are presented to computer 1000 as data 1016 that are temporarily stored in memory 1004 and then executed by processor 1002.

Generally describing an example configuration of the computer 1000, the processor 1002 may be a variety of various processors including dual microprocessor and other multiprocessor architectures. A memory 1004 may include volatile memory and/or non-volatile memory. Non-volatile memory may include, for example, ROM, PROM, and other memory. Volatile memory may include, for example, RAM, SRAM, DRAM, and other memory.

A disk 1006 may be operably connected to the computer 1000 via, for example, an input/output interface (e.g., card, device) 1018 and an input/output port 1010. The disk 1006 may be, for example, a magnetic disk drive, a solid state disk drive, a floppy disk drive, a tape drive, a Zip drive, a flash memory card, a memory stick, or other device. Furthermore, the disk 1006 may be a CD-ROM drive, a CD-R drive, a CD-RW drive, a DVD ROM drive, a Blu-Ray drive, an HD-DVD drive, or other device. The memory 1004 can store a process 1014 and/or a data 1016, for example. The disk 1006 and/or the memory 1004 can store an operating system that controls and allocates resources of the computer 1000.

The bus 1008 may be a single internal bus interconnect architecture and/or other bus or mesh architectures. While a single bus is illustrated, it is to be appreciated that the computer 1000 may communicate with various devices, logics, and peripherals using other busses (e.g., PCIE, 1394, USB, Ethernet). The bus 1008 can be types including, for example, a memory bus, a memory controller, a peripheral bus, an external bus, a crossbar switch, and/or a local bus.

The computer 1000 may interact with input/output devices via the i/o interfaces 1018 and the input/output ports 1010. Input/output devices may be, for example, a keyboard, a microphone, a pointing and selection device, cameras, video cards, displays, the disk 1006, the network devices 1020, and other devices. The input/output ports 1010 may include, for example, serial ports, parallel ports, and USB ports.

The computer 1000 can operate in a network environment and thus may be connected to the network devices 1020 via the i/o interfaces 1018, and/or the i/o ports 1010. Through the network devices 1020, the computer 1000 may interact with a network. Through the network, the computer 1000 may be logically connected to remote computers. Networks with which the computer 1000 may interact include, but are not limited to, a LAN, a WAN, and other networks.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable storage device storing computer-executable instructions that when executed by a computer cause the computer to perform a method, the method comprising:
    accessing a set of rateless erasure codes generated for an item, where the rateless erasure codes were generated according to an M/N policy, M and N being integers, M being greater than N, M–N being a minimum number of the set of M rateless erasure codes from which the item can be reconstructed;
    identifying a first safety factor for the item, where the first safety factor controls how many members of the set of rateless erasure codes are to be stored in an object store, where identifying the first safety factor includes automatically identifying the first safety factor as a function of a cost to acquire the item and as a function of a user of the item, as a function of a value associated with the item, or as a function of a source of the item;
    selecting a first number of the set of rateless erasure codes to be stored in the object store, where the first number is selected based, at least in part, on the first safety factor;
    providing the first number of rateless erasure codes to the object store;
    identifying a second safety factor for the item and a condition under which the second safety factor is to be used to control how many members of the set of rateless erasure codes are to be stored in the object store, where identifying the second safety factor includes automatically identifying the second safety factor as a function of a user of the item and as a function of a cost to acquire the item, as a function of a value associated with the item, or as a function of a source of the item;
    detecting the condition; and
    upon detecting the condition:
        selecting a second number of the set of rateless erasure codes to be stored in the object store, where the second number is selected based, at least in part, on the second safety factor; and
        providing the second number of rateless erasure codes to the object store.

2. The non-transitory computer-readable storage device of claim 1, where the first safety factor identifies how many rateless erasure codes beyond the minimum number M–N of rateless erasure codes are to be stored in the object store initially.

3. The non-transitory computer-readable storage device of claim 2, where the second safety factor identifies how many rateless erasure codes beyond the minimum number M–N of rateless erasure codes are to be stored in the object store when the condition is detected.

4. The non-transitory computer-readable storage device of claim 1, where identifying the first safety factor or identifying the second safety factor includes receiving an input from an interface.

5. The non-transitory computer-readable storage device of claim 1, where the condition is the age of the item.

6. The non-transitory computer-readable storage device of claim 1, where the condition is a number of copies of the item that are stored, the passage of an amount of time, the item reaching an age, or a number of devices on which the item is stored.

7. The non-transitory computer-readable storage device of claim 1, comprising:
    upon detecting the condition,
        selectively causing a rateless erasure code associated with the item to be removed from the object store upon determining that the number of rateless erasure codes associated with the item stored in the object store exceeds the number determined by the second safety factor.

8. The non-transitory computer-readable storage device of claim 1, comprising:
    upon detecting the condition,
        selectively causing a rateless erasure code associated with the item to be added to the object store upon determining that the number of rateless erasure codes associated with the item stored in the object store is less than the number determined by the second safety factor.

9. The non-transitory computer-readable storage device of claim 1, comprising automatically determining the first safety factor based on an attribute of the item, the attribute being an age of the item, a source of the item, or an owner of the item.

10. The non-transitory computer-readable storage device of claim 9, comprising automatically determining the second safety factor based on the attribute of the item.

11. An apparatus, comprising:
    a processor;
    a memory;
    a set of logics, where a member of the set of logics includes computer hardware or firmware; and
    an interface that connects the processor, the memory, and the set of logics;
    the set of logics comprising:
        a first logic that establishes a first subset of fountain codes to be stored by an object storage for an item during a first time period, where the first logic establishes the first subset of fountain codes based on a source for the item and based on a cost to acquire the item, based on a value associated with the item, or based on a user input concerning the item;
        a second logic that establishes a second subset of fountain codes to be stored by the object storage for the item during a second time period, where the second logic establishes the second subset of fountain codes based on the source for the item and based on a cost to acquire the item, based on a value associated with the item, or based on a second user input concerning the item; and
        a third logic that controls whether the first subset of fountain codes is stored by the object storage or the second subset of fountain codes is stored by the object storage based on whether a current time is during the first time period or during the second time period.

12. The apparatus of claim 11, comprising a fourth logic that generates a set of fountain codes from which the first subset of fountain codes or the second subset of fountain codes can be established, where the set of fountain codes is generated according to an M/N policy, where M identifies a maximum number of fountain codes to be generated for the item, where M–N identifies a minimum number of fountain codes from which the item can be reconstructed, where M>N, and where M and N are integers.

13. The apparatus of claim 12, comprising a fifth logic that presents a user interface concerning the item, where the fifth logic acquires, from the user interface, a value for M, a value for N, a value for the size of the first subset of fountain codes, or a value for the size of the second subset of fountain codes.

14. The apparatus of claim 13, where the fifth logic acquires, from the user interface, information describing the first time period, or information describing the second time period.

15. The apparatus of claim 11, where the second logic establishes a plurality of second subsets of fountain codes to be stored by the object storage for the item during a plurality of corresponding second time periods associated with a plurality of conditions, and
    where the third logic controls which of the plurality of second subsets of fountain codes are stored by the object storage based, at least in part, on which of the plurality of conditions is present.

\* \* \* \* \*